(12) United States Patent
Knox et al.

(10) Patent No.: US 6,400,165 B1
(45) Date of Patent: Jun. 4, 2002

(54) ULTRA-FAST PROBE

(75) Inventors: Wayne Harvey Knox, Holmdel; Chunhui Xu, Piscataway, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/496,985

(22) Filed: Feb. 2, 2000

(51) Int. Cl.[7] ............................................. G01R 31/302
(52) U.S. Cl. ..................... 324/752; 324/766; 250/214
(58) Field of Search ........................ 324/754, 96, 538, 324/752, 97, 612, 613, 614, 750, 753; 250/214 R, 225; 257/431

(56) References Cited

U.S. PATENT DOCUMENTS

| | | | |
|---|---|---|---|
| 4,851,767 A | * 7/1989 | Halbout | 324/766 |
| 4,928,058 A | * 5/1990 | Williamson | 324/753 |
| 4,978,910 A | * 12/1990 | Knox | 324/96 |
| 5,442,300 A | * 8/1995 | Horel | 324/762 |
| 5,844,288 A | * 12/1998 | Mourou | 257/431 |
| 6,160,252 A | * 12/2000 | Mourou | 250/214.1 |

\* cited by examiner

*Primary Examiner*—Michael J. Sherry
*Assistant Examiner*—Trung Q. Nguyen
(74) *Attorney, Agent, or Firm*—Arthur J. Torsiglieri

(57) ABSTRACT

An electrooptic probe for measuring the voltage at regions of an ultra fast device under test includes a standard gallium arsenide substrate that includes on a front surface a film of LT GaAs whose surface includes a conductive stripe that includes first and second portions separated by a gap, the first portion for contacting the region under test, and the second portion for connection to a measuring instrument. The probe is irradiated with a pulsed beam of light, advantageously from a mode-locked femtosecond laser focused at the gap in the stripe and of appropriate two photons, for making conducting by two-photon absorption the region of the film underlying the gap. Preferably the beam irradiates the back surface of the probe to pass through its substrate to reach the gap. Alternatively the beam can irradiate the back surface of the device under test to reach the gap.

12 Claims, 1 Drawing Sheet

ULTRA-FAST PROBE

FIELD OF THE INVENTION

This invention relates to an electrooptic probe for test and characterization of ultra-fast circuits, such as the picosecond fast circuits being used in optical communication systems and the method of using the probe.

BACKGROUND OF THE INVENTION

For the measurement of ultra-high frequency signals in electronic circuits, such as those used in optical communication systems, it is advantageous to have a freely positionable probe whose speed of response is even faster than that of the signals being measured. For this purpose, there have been developed probes that use photoconductive switches. Typical of probes of this kind is the photoconductive sampling probe described in a paper entitled "A Fiber-Mounted Micromachined Photoconductive Probe with 15 nV/Hz$^{1/2}$ Sensitivity", App. Phys. Letter 69 Sep. 13, 1996.

This probe comprises as the switching region a film that has been grown on a standard monocrystalline gallium arsenide substrate by low temperature molecular beam epitaxy and that is generally described as LT GaAs. In an article in *Applied Physics Letters*, Vol. 59, Sep. 16, 1991, pp. 1491–1493, entitled "Low-Temperature Crown (GaAs Quantum Wells: Femtosecond Nonlinear Optical and Parallel-Feed Transport Studies," LT GaAs material is shown to include semi-insulating electrical characteristics, subpicosecond photoconductive decay time and reasonably high mobility making possible the generation of subpicosecond electrical pulses. This high impedance probe has microvolt sensitivity with picosecond time. resolution and megohm impedance, thus enabling non-invasive tests of ultra-high speed circuits. However, these probes needed to be designed to be very thin to allow the short light pulses that are used to activate the probe to be transmitted sufficiently through the thickness of the absorptive standard GaAs substrate of the probe to make conducting the photoconductive LT GaAs switching film. Typically with such probes, the LT GaAs is grown on a substrate that was initially at least hundreds of microns thick. Subsequently the substrate typically has been thinned to no more than one or two microns and preferably is removed essentially entirely. As a result such probes tend to be difficult and expensive to make and also are quite fragile, limiting their use. Moreover, generally the circuitry of the device under test is at its top surface making it impractical to transmit the activation light pulses through the device under test to the probe.

The desirable properties of LT GaAs mentioned above, particularly the short photoconductive decay time and high mobility, are primarily the result of the presence in such material of excess arsenic that provides dangling bonds or defect sites that capture quickly the free carriers generated by the excitation light. The excess arsenic occurs because LT GaAs generally is grown at temperatures in the range of about 190° C. and 300° C. in contrast to the range of between about 600° C. and 700° C. normally used for growing standard GaAs and in an atmosphere of excess arsenic.

SUMMARY OF THE INVENTION

The present invention provides an optoelectronic probe that includes on one surface a photoconductive switch, advantageously a relatively thin film of LT GaAs, that is optimized for two-photon operation. As such, it can be activated by an activation light beam of multiple excitation photon energy that irradiates the opposite surface of the probe. Such a beam can pass through with little absorption a relatively thick substrate, advantageously at least several hundred microns thick, supporting the switching layer so long as the excitation photon energy of the beam is below the bandgap of the substrate material of the probe. Advantageously, for two-photon excitation the light can be provided by a mode-locked femtosecond pulsed laser of 1.55 microns wavelength of the kind known in the art. As a consequence, there is no need to thin the substrate, since thicknesses of several hundred microns are now tolerable. Moreover, if there is chosen an activation light of appropriate excitation photon energy, alternatively the light beam can be applied to pass first through the device under test to activate the switching film of the probe.

In addition to the use of a film of LT GaAs, a GaAs film having dangling bonds and/or captive sites sufficient to provide the desired short photoconductive decay time and high mobility can be provided in other ways. These include Erbium doping, and ion or proton bombardment.

The invention will be better understood from the following more detailed description taken in conjunction with the accompanying drawing.

DETAILED DESCRIPTION

Figure 1:
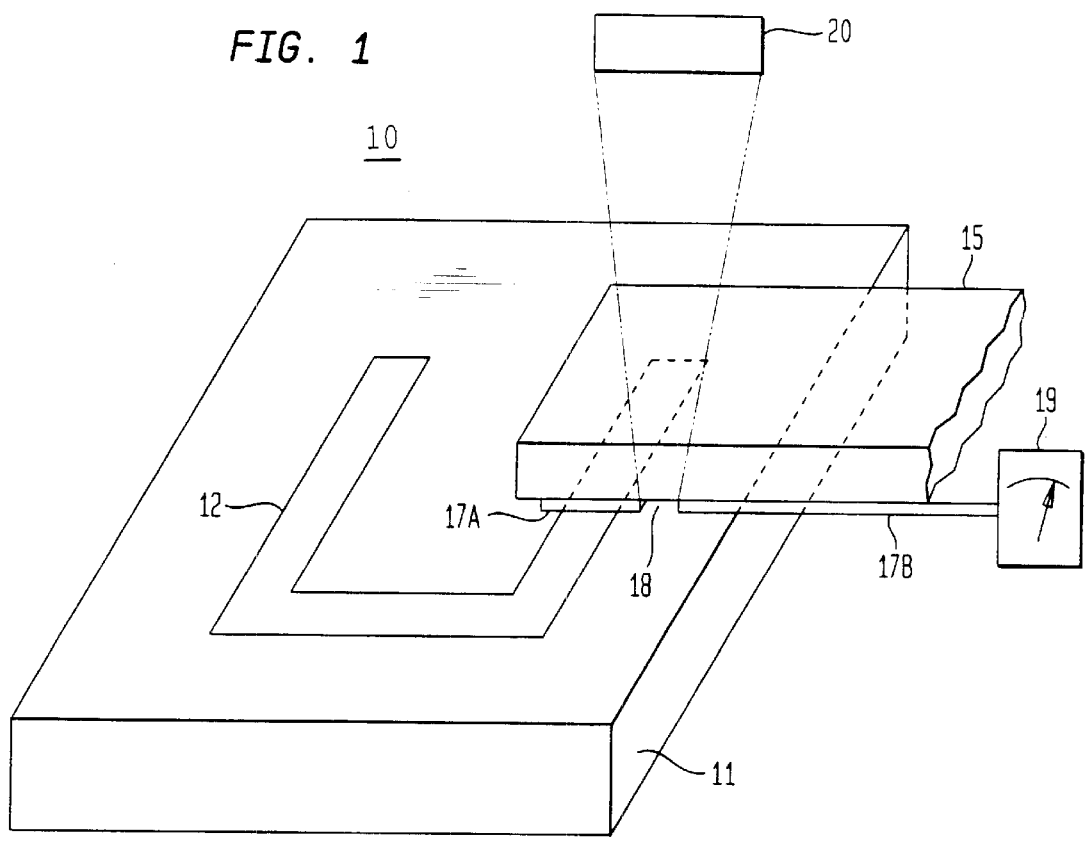
FIG. 1 is a perspective drawing of a probe in accordance with the invention positioned to measure the voltage at a desired region of an electronic circuit.
Figure 2:
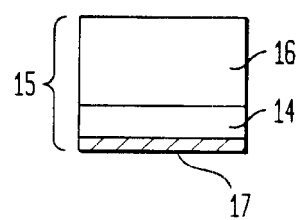
FIG. 2 shows a cross-section of the probe shown in FIG. 1.

FIG. 1 shows a device under test (DUT) 10 that comprises typically a high speed chip 11 that includes on its top surface an electronic circuit 12 being tested. For doing a test probe 15 is positioned adjacent the chip. As shown in FIG. 2, the probe includes a substrate 16, typically of standard GaAs of at least several hundred microns thick and advantageously about 500 microns thick, on whose bottom surface is a relatively thin film 14 of LT GaAs, typically no more than several microns thick and preferably about one micron thick. FIG. 2 shows a cross-section of the probe that includes the substrate 16 and film 14, whose bottom surface includes a conductive stripe 17 that is typically 10 microns wide and includes a gap 18, typically about one micron wide. When the probe is in position, as shown in FIG. 1, one end 17A of the stripe 17 is designed to be in electrical contact with the region of the electrical circuit 12 where the voltage is to be measured while the other end 17B of the stripe 17 is connected to a suitable measuring device 19, such as a high speed oscilloscope or lock-in amplifier. Also the ground of the device under test is connected to the ground of the measuring device, as is customary. The electrical path to the measuring device is closed by making the portion of the film in the gap 18 briefly photoconductive. This is done by focusing an activation beam from a suitable laser 20, preferably a femtosecond pulse laser, such as a mode-locked fiber laser at 1.55 microns. The energy of the pulse photons needs to be below the bandgap energy of whichever of the DUT or probe substrate the excitation light is passed through to make the gap portion of the film photoconductive by two-photon free carrier activation to close the switch. This is in contrast to the one-photon nature of the free-carrier generation of the prior art probes that require that the probe substrate be so little absorptive to the excitation light that excitation by light passing through the probe substrate was only feasible to close the switch when the substrate was at most extremely thin and consequently highly fragile. However, with the two-photon excitation to activate the photoconductive switch contemplated by the invention, there is used laser light with photon energies below the bandgap of the probe substrate, such as that provided by a mode-locked femtosecond laser at 1.55 microns, and now the excitation beam can travel through a relatively thick substrate with negligible attenuation. Accordingly, by focusing the excitation beam to at the gap region 18, significant two-photon absorption, enough to close the switch, can readily occur at the gap region. This makes feasible the more desirable back side activation of the switch through the probe substrate provided only that the substrate back side be well polished to minimize scattering of the excitation light. In some instances it may be desirable also to include an anti-reflection coating on this back side of the substrate.

Alternatively, if the excitation beam energy is chosen appropriately to pass with little attenuation through the DUT, the switch of the probe may be activated by multiple photon excitation by a beam passing through the DUT.

Although two-photon absorption is much weaker than one photon absorption, for switching average power levels on the order of ten milliwatts should be sufficient, which is within the range of available mode-locked femtosecond lasers.

Although degenerate two-photon absorption with a single excitation beam is presently strongly preferred, other multi-photon excitation energy arrangements should be similarly feasible. For example, one might use two-photon absorption with an excitation beam of two components of different wavelengths or even three-photon absorption.

Moreover materials other than those mentioned can be used for the probe as well as for the device under test, as long as the activation beam is of a suitable energy. Accordingly, there are feasible embodiments of the invention other than that described herein as exemplary of the invention. In particular, semiconductors, other than gallium arsenide, that can be prepared to include in their structure dangling bonds or defect sites that result in photoconductive films of high resistively, subpicosecond photoconductive decay times, and high mobility making possible the generation of subpicosecond electrical pulses should be feasible in place of the LT GaAs film.

What is claimed is:

1. Apparatus for measuring the voltage at a desired region of a device under test comprising
   a probe comprising a relatively thick semiconductive substrate that includes on one of two opposed surfaces a relatively thin semiconductive film of a photoconductive material that is of high resistively and that supports on its surface a conductive stripe that includes a gap, the probe being adapted to be positioned with respect to the device under test such that the portion on one side of the gap can be positioned in contact with the region whose voltage is to be measured, and the portion on the other side of the gap can be connected to a measuring instrument, and
   means for providing pulsed multi-photon excitation light by way of the substrate to the region of the film exposed in the gap whereby the conductance of the gap is increased sufficiently that the voltage at the region of contact of the device under test can be measured,
   characterized in that the wavelength of the excitation light is such as to pass with little attenuation through the relatively thick substrate because its photon excitation energy is less than the band gap energy of the substrate.

2. The apparatus for measuring of claim 1 in which the substrate is at least several hundred microns thick and the film is no more than several microns thick.

3. The method of measuring the voltage at a desired region of a device under test that comprises positioning apparatus in accordance with claim 2 in said position for measuring.

4. The apparatus for measuring of claim 2 in which the substrate is standard monocrystalline gallium arsenide and the film is low temperature gallium arsenide that has been grown epitaxially on said substrate and the means for applying the multi-photon excitation is a femtosecond pulsed mode-locked laser at an appropriate wavelength to provide photons of energy that will pass with little attenuation through the substrate.

5. The apparatus of claim 4 in which the laser provides excitation light of 1.55 microns wavelength.

6. The method of measuring the voltage at a desired region of a device under test that comprises positioning apparatus in accordance with claim 5 in said position for measuring.

7. The method of measuring the voltage at a desired region of a device under test that comprises positioning apparatus in accordance with claim 1 in said position for measuring.

8. The method of measuring the voltage at a desired region of a device under test that comprises positioning apparatus in accordance with claim 7 in said position for measuring.

9. Apparatus for measuring the voltage at a desired region of an electric circuit on the top surface of a semiconductive substrate of a device under test comprising a probe comprising a relatively thick semiconductive substrate that includes on one of two opposed surfaces a relatively thin semiconductive film of a photoconductive material that is of high resistively and that supports on its surface a conductive stripe that includes a gap, the probe being adapted to be positioned with respect to the device under test such that the portion on one side of the gap can be positioned in contact with the region whose voltage is to be measured and the portion on the other side of the gap can be connected to a measuring instrument, and
   means for providing pulsed multi-photo excitation light by way of the substrate at the region of the film exposed in the gap whereby the conductance of the gap is increased sufficiently that the voltage of the region of contact of the device under test can be measured,
   characterized in that the wavelength of the excitation light is such as to pass with little attenuation through the substrate of the device under test to the region of the film exposed in the gap whereby the conductance of the gap is increased sufficiently that the voltage at the region of contact of the device under test can be measured.

10. The apparatus for measuring claim 9 in which the laser-provided excitation light is of 1.55 microns wavelength.

11. The method for measuring the voltage at a desired region of an electric circuit at the top surface of a semiconductive substrate comprising the steps of positioning the apparatus of claim 9 in position for measuring the voltage at the desired region.

12. A method for measuring the voltage at a particular region of an electronic circuit comprising the steps of positioning, in contact with the region of the circuit at which the voltage is to be measured, a first surface of a probe, the probe including on such surface a conductive stripe that includes a gap and that contacts said region of the electronic circuit, and irradiating the probe surface opposite the first surface with a two-photon excitation light beam that passes through the probe for converting the gap from an insulating state to a conducting state for closing electrical contact to said region of the circuit, characterized in that the probe comprises both a substrate that is substantially transparent to the light beam and, at said first surface, a layer of a material that is normally an insulator and is made conducting when irradiated by the two-photon excitation light beam for closing the gap in the conductive stripe and completing the contact to said region.

* * * * *